United States Patent [19]  [11] 3,934,157
Evans  [45] Jan. 20, 1976

[54] TTL CIRCUIT

[75] Inventor: William Joshua Evans, Berkeley Heights, N.J.

[73] Assignee: Bell Telephone Laboratories, Incorporated, Murray Hill, N.J.

[22] Filed: Sept. 23, 1974

[21] Appl. No.: 508,081

[52] U.S. Cl. ............... 307/213; 307/215; 307/218; 307/299 A
[51] Int. Cl.² ..................... H03K 19/08; H03K 5/01
[58] Field of Search .......... 307/213, 215, 270, 254, 307/299 A, 317 A

[56] References Cited
UNITED STATES PATENTS

| | | | |
|---|---|---|---|
| 3,522,444 | 8/1970 | Lourie | 307/299 A |
| 3,571,616 | 3/1971 | Andrews | 307/299 A |
| 3,867,644 | 2/1975 | Cline | 307/317 A |

Primary Examiner—Stanley D. Miller, Jr.
Assistant Examiner—B. P. Davies
Attorney, Agent, or Firm—P. Abolins; L. C. Canepa

[57] ABSTRACT

A logic gate circuit includes parallel drive of an output transistor and an inverter transistor by an input transistor. The inverter transistor then drives an active pull-up transistor which improves switching speed. The parallel drive of the invention allows the use of the active pull-up transistor without requiring a change in circuit voltage levels.

6 Claims, 3 Drawing Figures

TTL CIRCUIT

BACKGROUND OF THE INVENTION

This invention relates to an improved logic arrangement suitable for incorporation in an integrated semiconductor device.

Included in the types of digital logic circuits which are particularly amenable to fabrication as monolithic integrated circuit networks are transistor-transistor logic (TTL) circuits. An example of such a circuit is taught in U.S. Pat. No. 3,629,609 issued to R. A. Pedersen et al. on Dec. 21, 1971. Operating characteristics of TTL circuits which are often important in applications include switching speed, response to load variations, compatibility of voltage levels, and immunity to spurious signals.

The immunity of logic circuits to spurious signals is generally referred to in terms of the circuit's noise margins. These noise margins are defined relative to a threshold which is itself defined as the level of the voltage applied at the input of the gate required to produce the same voltage level at the output of that gate.

The first noise margin, or low-level noise margin, is the difference between the maximum low-level input signal voltage and the threshold voltage. Analogously, the second, or high-level noise margin, is the difference between the minimum high-level voltage and the threshold voltage. Further, the signal swing of the circuit is defined as the difference between the maximum high-level voltage and the minimum low-level input signal voltage.

To improve the operation of TTL circuits it is desirable to have increased switching speed and relatively quick charging of any output capacitance. It is further desirable to attain these objectives while maintaining voltage levels and noise margins compatible with prevalent TTL circuits.

An example of a TTL circuit which includes a favorable switching speed and a relatively fast charging of output capacitance is U.S. Pat. No. 3,571,616 issued to J. R. Andrews on Mar. 23, 1971. The Andrews patent discloses a circuit which uses a pull-up transistor to reduce the resistance of the charging path of the output capacitance. However, along with reduced resistance in the charging path, the circuit of the Andrews patent has some increased voltage levels. As a result, the voltage levels may not be compatible with certain other TTL circuits. It would be desirable to achieve the faster switching possible through the use of a pull-up transistor without the necessity to change voltage levels.

SUMMARY OF THE INVENTION

The invention is a logic gate circuit which includes parallel drive of an output transistor and an inverter transistor by an input transistor. The input transistor has an emitter connected to an input node and a base connected to a voltage source, V. The collector of the input transistor is connected to both the base of the output transistor and the base of the inverter transistor. The emitter of the output transistor is grounded. The collector of the output transistor is connected to an output node. The emitter of the inverter transistor is connected to ground. The collector of the inverter transistor is connected both to the voltage source and to the base of a pull-up transistor. The emitter of the pull-up transistor is connected to the output node. The collector of the pull-up transistor is connected to the voltage source.

In operation, an input signal is applied to the input node. The input signal determines whether the voltage at the collector of the input transistor is sufficient to turn on the output transistor and the inverter transistor. If the voltage is insufficient to turn on these two transistors, the inverter transistor functions to turn on an active pull-up transistor. That is, when the inverter transistor is OFF the base of the pull-up transistor is isolated from ground. The base voltage of the pull-up transistor rises toward the voltage source, V, until the pull-up transistor turns ON. When the output transistor is OFF, any output capacitance can be charged through a charging path which includes the active pull-up transistor. Such a path can have an advantageously low resistance.

The voltage level required to turn on the output transistor is the same as if the active pull-up transistor were not used. This is particularly advantageous because it permits the voltage levels of the logic circuit of the invention to be compatible with certain other logic circuits not using a pull-up transistor.

DETAILED DESCRIPTION

Figure 1:
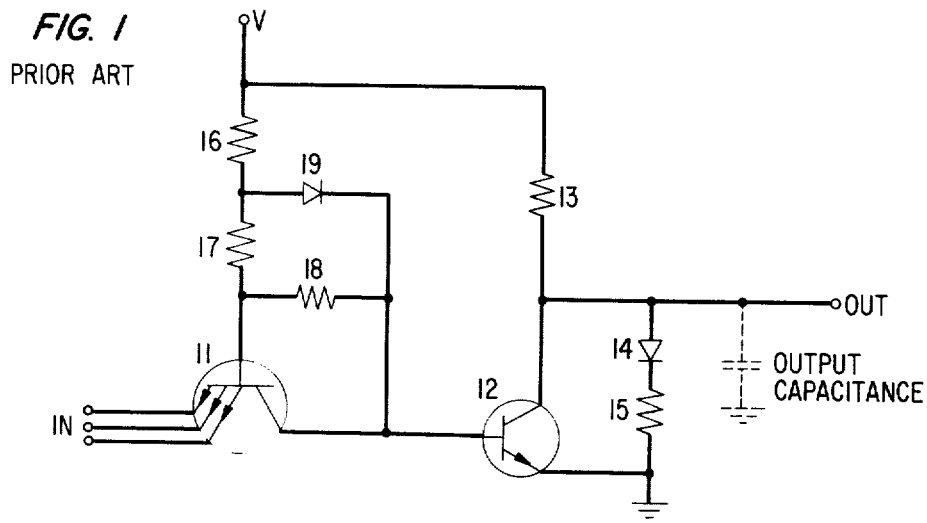
FIG. 1 shows a schematic drawing of a TTL logic gate of the prior art.
Figure 2:
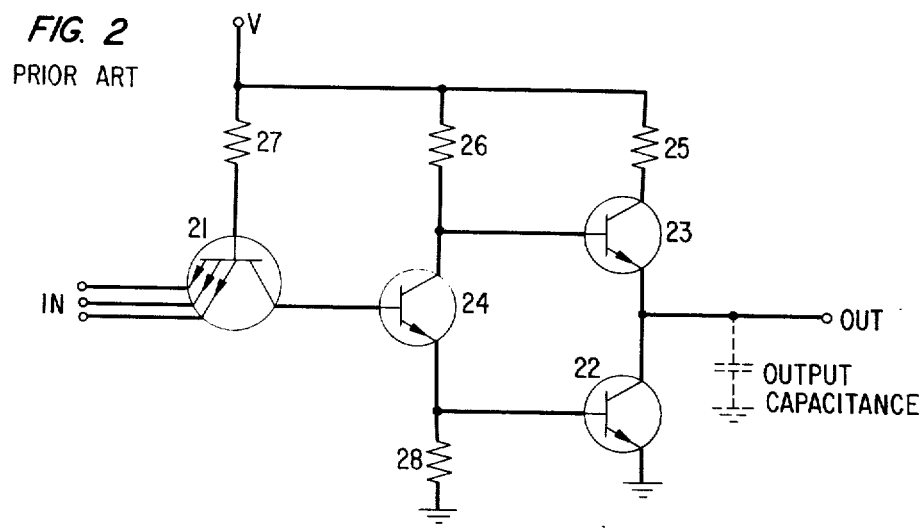
FIG. 2 shows a schematic drawing of a TTL logic gate of the prior art which includes a pull-up transistor.
Figure 3:
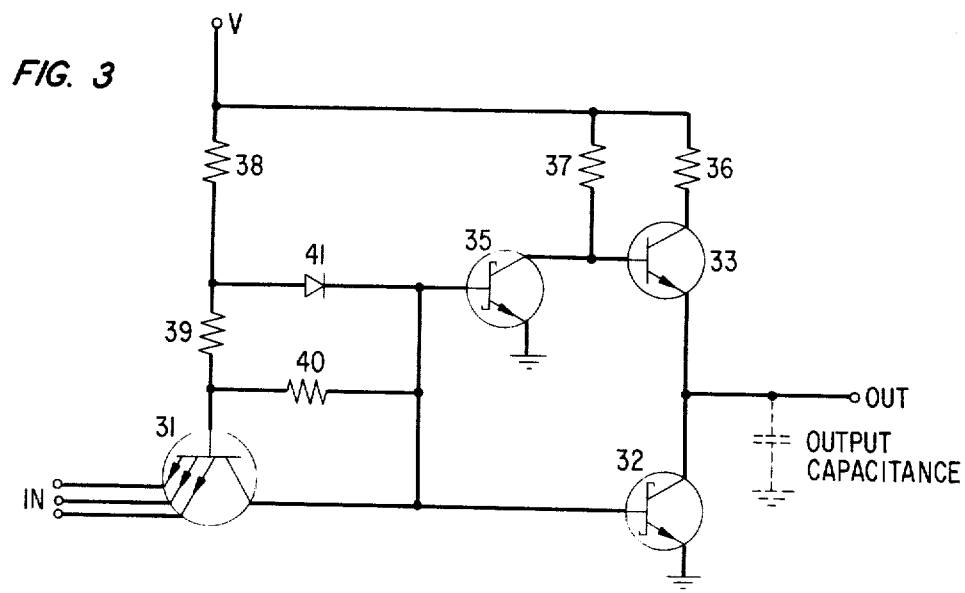
FIG. 3 shows a schematic drawing of a TTL logic gate in accordance with this invention.

Logic circuits of the prior art are shown in FIGS. 1 and 2. The preferred embodiment of the present invention is shown in FIG. 3. All the circuits include an input transistor and an output transistor.

FIG. 1 illustrates a typical transistor-transistor logic (TTL) gate circuit the operation of which is described in detail in the cited Pedersen patent. Each of the emitters of an input transistor 11 is connected to a different respective input node. The base of input transistor 11 is connected through a series combination of resistors 16 and 17 to a voltage source, V. A resistor 18 is connected between the base and collector of input transistor 11. A diode 19 is connected between the collector of input transistor 11 and a node between resistors 16 and 17. As is known, the combination of resistor 18 and diode 19 is used advantageously to limit the inverse current flowing in input transistor 11. The base of an output transistor 12 is connected to the collector of input transistor 11. The collector of output transistor 12 is directly connected to an output node and, in addition, is connected to the source V via a resistor 13. The emitter of the output transistor is connected to ground.

Input signals applied to the input nodes of FIG. 1 control the ON-OFF condition of input transistor 11. In turn, input transistor 11 is used to control the ON-OFF condition of output transistor 12. More particularly, when a logical ZERO is applied to any of the emitters of input transistor 11 the base-emitter junction of transistor 11 is forward-biased. For example, a logical ZERO may be represented by a 0 V potential level and the source voltage may be 3 V. Typically, transistor 11 is then conducting and there is a voltage drop between the emitter and collector of about 0.2 V. Hence, the voltage of the collector of transistor 11 is about 0.2 V. Output transistor 12 is OFF because it requires about 0.7 V applied to the base of the transistor to turn it ON.

When a logical ONE is applied to each of the emitters of input transistor 11, the potential level of the collector of transistor 11 rises. As the potential level rises through 0.7 V there is sufficient voltage to turn ON output transistor 12. Advantageously, this threshold voltage is about midway between the potential levels representing a logical ONE and a logical ZERO.

When output transistor 12 is OFF, the output node connected to the collector of transistor 12 is at its high level or logical ONE level. When output transistor 12 is ON, the output node is at its low or logical ZERO level. When output transistor 12 is switching OFF, any output capacitance must be charged through resistor 13 connected between the voltage source V and the output node. Accordingly, the switching speed of the circuit is limited by the RC time constant of the output capacitance and resistor 13.

It is known that the charging time of the output capacitance can be reduced by clamping the output with a series combination of a diode 14 and a resistor 15 in parallel with the output. In effect, this reduces the voltage magnitude to which the output capacitance must charge before the alternate path including diode 14 and resistor 15 conducts. As a result, the switching time is reduced. However, this solution is not entirely satisfactory. The output voltage is reduced and, as indicated above, the noise margin is also reduced.

FIG. 2 shows a prior art configuration which reduces the RC time constant for the output capacitance of the circuit shown in FIG. 1. A pull-up transistor 23 has been inserted into the logical gate configuration and replaces resistor 13 as shown in FIG. 1. The emitter of pull-up transistor 23 is connected to an output node. The base of pull-up transistor 23 is connected to a voltage source V through a resistor 26. A resistor 25 is connected between the collector of transistor 23 and the voltage source V. As in FIG. 1, there is an output transistor 22 having the collector connected to the output node and the emitter connected to ground.

Additionally, a phase splitting transistor 24 is connected to switch transistors 23 and 22. The emitter of phase splitting transistor 24 is connected to the base of output transistor 22 and to ground through a resistor 28. The collector of phase splitting transistor 24 is connected to the base of pull-up transistor 23. The base of phase splitting transistor 24 is connected to the collector of input transistor 21. The base of input transistor 21 is connected through a resistor 27 to the voltage source, V. The emitters of input transistor 21 are each connected to a different respective input node. In operation, when transistor 23 is ON, transistor 22 is OFF; when transistor 22 is ON, transistor 23 is OFF.

The circuit of FIG. 2 has increased switching speed compared to the circuit of FIG. 1. When output transistor 22 is switching OFF, the output capacitance can be charged through pull-up transistor 23 and resistor 25. Resistor 25 can be significantly smaller in magnitude than resistor 13 of FIG. 1. For example, resistor 25 can be about 20 to 50 ohms while a typical value for resistor 13 is about 2,000 ohms. Accordingly, the resistance of a path for charging the output capacitance is substantially less. As a result, the RC time constant of the charging of the output capacitance is reduced. This improves switching time.

The alternate switching of transistors 22 and 23 is controlled by phase splitting transistor 24. More specifically, inputs applied to the emitters of input transistor 21 determine the voltage on the collector of the input transistor and, in turn, the signal applied to the base of phase splitting transistor 24. When phase splitting transistor 24 is ON, the base of transistor 22 is at its high state and the base of transistor 23 is at its low state. Conversely, when transistor 24 is OFF, the base of transistor 22 is at its low state and the base of transistor 23 is at its high state.

A result of adding phase splitting transistor 24 to the circuit is that the threshold input voltage level which must be applied to input transistor 21 to turn ON phase splitting transistor 24 and then output transistor 22 must be increased over the level required by the circuit of FIG. 1. As noted, the threshold input voltage of FIG. 1 must be sufficient to provide a voltage of 0.7 V at the collector of the input transistor. In contrast, the threshold input voltage of FIG. 2 must be sufficient to provide a voltage twice that, i.e., about 1.4 V, at the collector of the input transistor. This is because the voltage at the collector of input transistor 21 must be sufficient to provide for the base-emitter voltage drops of both transistor 24 and transistor 22.

If the same high-level noise margins are to be maintained for the circuit of FIG. 2 as those for the circuit of FIG. 1, the voltage representing a logical ONE must be increased. As a result, a logical ONE output from the circuit of FIG. 1 could not be used as a logical ONE input for the circuit of FIG. 2. There are occasions when it is desirable to have improved switching while maintaining the logical ONE potential level of the circuit of FIG. 1.

Further, because of the higher voltage requirements, the circuit of FIG. 2 typically has a voltage supply of greater magnitude than that of FIG. 1. For example, a typical voltage supply for a circuit in accordance with FIG. 1 is 3 volts. A typical voltage supply for a circuit in accordance with FIG. 2 is 5 volts. It can be appreciated that it is often desirable to be able to use the same power supply for all logic circuits in a given application.

FIG. 3 shows a circuit in accordance with this invention. An input transistor 31 can have multiple emitters each connected to a different respective input node. An output transistor 32 has an emitter connected to ground, a base connected to the collector of input transistor 31, and a collector connected to an output node. An inverter transistor 35 has an emitter connected to ground, a base connected to the collector of input transistor 31 and a collector. Advantageously, both transistor 32 and transistor 35 are Schottky clamped. A pull-up transistor 33 has an emitter connected to the output node, a base connected to the collector of inverter transistor 35 and a collector. A voltage source V is connected through a resistor 36 to the collector of transistor 33, through a resistor 37 to the collector of transistor 35, and through a serial combination of resistors 38 and 39 to the base of input transistor 31. Also, a by-pass resistor 40 is connected between the base and collector of input transistor 31. Further, a by-pass diode 41 is connected between the collector of input transistor 31 and a node between resistors 38 and 39.

In operation, input signals representing logical information are applied to the input nodes. When any of the applied input signals is a logical ZERO, there is a relatively low voltage at the collector of input transistor 31 which is insufficient to turn on output transistor 32. Similarly, this low voltage is insufficient to turn on inverter transistor 35. Since transistor 35 is off, the base of pull-up transistor 33 is isolated from ground and the voltage supplied to the base of pull-up transistor 33 from voltage source V is sufficient to turn on pull-up transistor 33. With transistor 33 ON, a voltage from voltage source V is applied to the output node. This voltage represents a logical ONE.

When all of the inputs applied to the input nodes are a logical ONE, the voltage at the collector of input transistor 31 is sufficient to turn on output transistor 32 and inverter transistor 35. With transistor 35 conducting, the base of pull-up transistor 33 is essentially connected to ground and transistor 33 is OFF. Accordingly, the output node is isolated from voltage source V by nonconducting transistor 33 and is connected to ground through conducting transistor 32. This represents a low voltage or a logical ZERO.

It can be appreciated that when output transistor 32 is switched OFF, any output capacitance can be charged through a conducting path including pull-up transistor 33. As with resistor 25 of FIG. 2, resistor 36 is in this path and can be substantially less than the resistor 13 of FIG. 1.

However, unlike the logic circuit shown in FIG. 2, this advantage has been obtained without increasing the input threshold voltage needed to switch output transistor 32. That is, as in the logic circuit of FIG. 1, the base of output transistor 32 is directly connected to the collector of input transistor 31. Therefore, the input threshold voltage must be sufficient to provide at the collector of the input transistor a voltage equal to one base-emitter drop, or about 0.7 V. As indicated above, since the input threshold voltage is not changed, the potential level representing a logical ONE need not be changed to maintain the same high-level noise margin. Further, this means that the power supply for the circuits of FIG. 1 and FIG. 3 can be the same. As a result, there is provided a logic circuit with improved speed which, nevertheless, is compatible with the input voltage levels of logic circuits without a pull-up transistor, such as that shown in FIG. 1.

A typical magnitude for the power supply of FIG. 3 is 3 volts. Illustrative voltage levels are 0.25 volts to represent a logical ZERO and 2.3 volts to represent a logical ONE. Examples of resistor values are: resistor 36 = 100 ohms, resistor 37 = 500 ohms, resistor 38 = 1000 ohms, resistor 39 = 200 ohms, and resistor 40 = 800 ohms.

Various other modifications and variations will no doubt occur to those skilled in the various arts to which this invention pertains. All such variations which basically rely on the teachings through which this description has advanced the art are properly considered within the scope of this invention.

What is claimed is:

1. A logic gate comprising:
    an input transistor having a base terminal, a collector terminal and at least one emitter terminal connected to an input node,
    an output transistor having an emitter terminal adapted to be connected to ground, a base terminal connected directly to the collector terminal of the input transistor and a collector terminal connected to an output node,
    an inverter transistor having an emitter terminal adapted to be connected to ground, a base terminal connected directly to the collector terminal of the input transistor and a collector terminal, and
    a pull-up transistor having an emitter terminal connected to the output node, a base terminal connected to the collector terminal of the inverter transistor and a collector terminal.

2. A logic gate as recited in claim 1 wherein said input transistor includes multiple emitters each connected to a different respective input node.

3. A logic gate as recited in claim 2 further comprising:
    a series combination of a first and second resistor connected to the base of the input transistor,
    a third resistor connected to the collector of the inverter transistor,
    a fourth resistor connected to the collector of the pull-up transistor,
    a fifth resistor connected between the base of the input transistor and the collector of the input transistor, and
    a diode connected between the collector of the input transistor and an intermediate node between the first and second resistors.

4. A logic gate as recited in claim 3 wherein:
    the first resistor is about 1,000 ohms,
    the second resistor is about 200 ohms,
    the third resistor is about 500 ohms,
    the fourth resistor is about 100 ohms, and
    the fifth resistor is about 800 ohms.

5. A logic gate as recited in claim 4 further comprising a source of D.C. potential connected to the base terminal of the input transistor through the series combination, the collector terminal of the inverter transistor through the third resistor, and the collector terminal of the pull-up transistor through the fourth resistor.

6. A logic gate as recited in claim 5 wherein the source of D.C. potential has a magnitude of about 3 volts.

* * * * *